United States Patent
Shimizu et al.

(10) Patent No.: US 11,721,984 B2
(45) Date of Patent: Aug. 8, 2023

(54) BATTERY MONITORING SYSTEM, VEHICLE, BATTERY MONITORING DEVICE

(71) Applicant: TOYOTA JIDOSHA KABUSHIKI KAISHA, Toyota (JP)

(72) Inventors: Osamu Shimizu, Komaki (JP); Takaya Koshii, Nagoya (JP)

(73) Assignee: TOYOTA JIDOSHA KABUSHIKI KAISHA, Toyota (JP)

(*) Notice: Subject to any disclaimer, the term of this patent is extended or adjusted under 35 U.S.C. 154(b) by 0 days.

(21) Appl. No.: 17/526,323

(22) Filed: Nov. 15, 2021

(65) Prior Publication Data
US 2022/0200297 A1    Jun. 23, 2022

(30) Foreign Application Priority Data
Dec. 22, 2020   (JP) ................................ 2020-212313

(51) Int. Cl.
| | |
|---|---|
| *G01R 31/00* | (2006.01) |
| *H02J 7/00* | (2006.01) |
| *B60L 58/10* | (2019.01) |
| *G01R 31/371* | (2019.01) |
| *G01R 31/382* | (2019.01) |

(52) U.S. Cl.
CPC .......... *H02J 7/00032* (2020.01); *B60L 58/10* (2019.02); *G01R 31/371* (2019.01); *G01R 31/382* (2019.01); *H02J 7/0047* (2013.01)

(58) Field of Classification Search
USPC ......................................... 324/426, 432–435
See application file for complete search history.

(56) References Cited

U.S. PATENT DOCUMENTS

2019/0033395 A1*   1/2019   Karner .................. H01M 10/48

FOREIGN PATENT DOCUMENTS

JP          2006-228490 A       8/2006

* cited by examiner

*Primary Examiner* — Vincent Q Nguyen
(74) *Attorney, Agent, or Firm* — Oblon, McClelland, Maier & Neustadt, L.L.P.

(57) ABSTRACT

A battery monitoring system includes a battery pack for a vehicle and a battery monitoring device that monitors a state of a battery cell included in the battery pack. The battery pack includes an acquisition unit configured to acquire battery information of the battery cell, a first storage unit configured to store the acquired battery information, and a first communication unit configured to transmit the battery information stored in the first storage unit to the battery monitoring device. The battery monitoring device includes a second communication unit configured to receive the battery information transmitted from the first communication unit, a second storage unit configured to store the received battery information, and a third storage unit configured to store initial battery information indicating a battery state at the time of manufacture of the battery pack.

4 Claims, 4 Drawing Sheets

FIG. 2
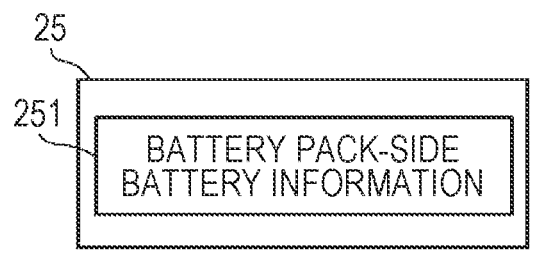
FIG. 3
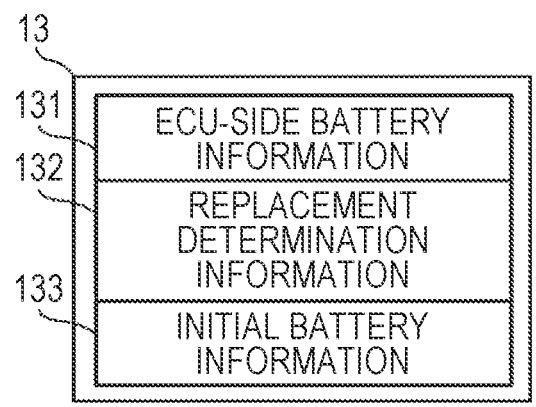
FIG. 4
| INFORMATION ITEM 1 | 0x00000000 |
| --- | --- |
| INFORMATION ITEM 2 | 0x00000000 |
| INFORMATION ITEM 3 | 0x00000000 |
| ⋮ | ⋮ |
| INFORMATION ITEM 9 | 0x00000000 |
| INFORMATION ITEM 10 | 0xAAAAAAAA |

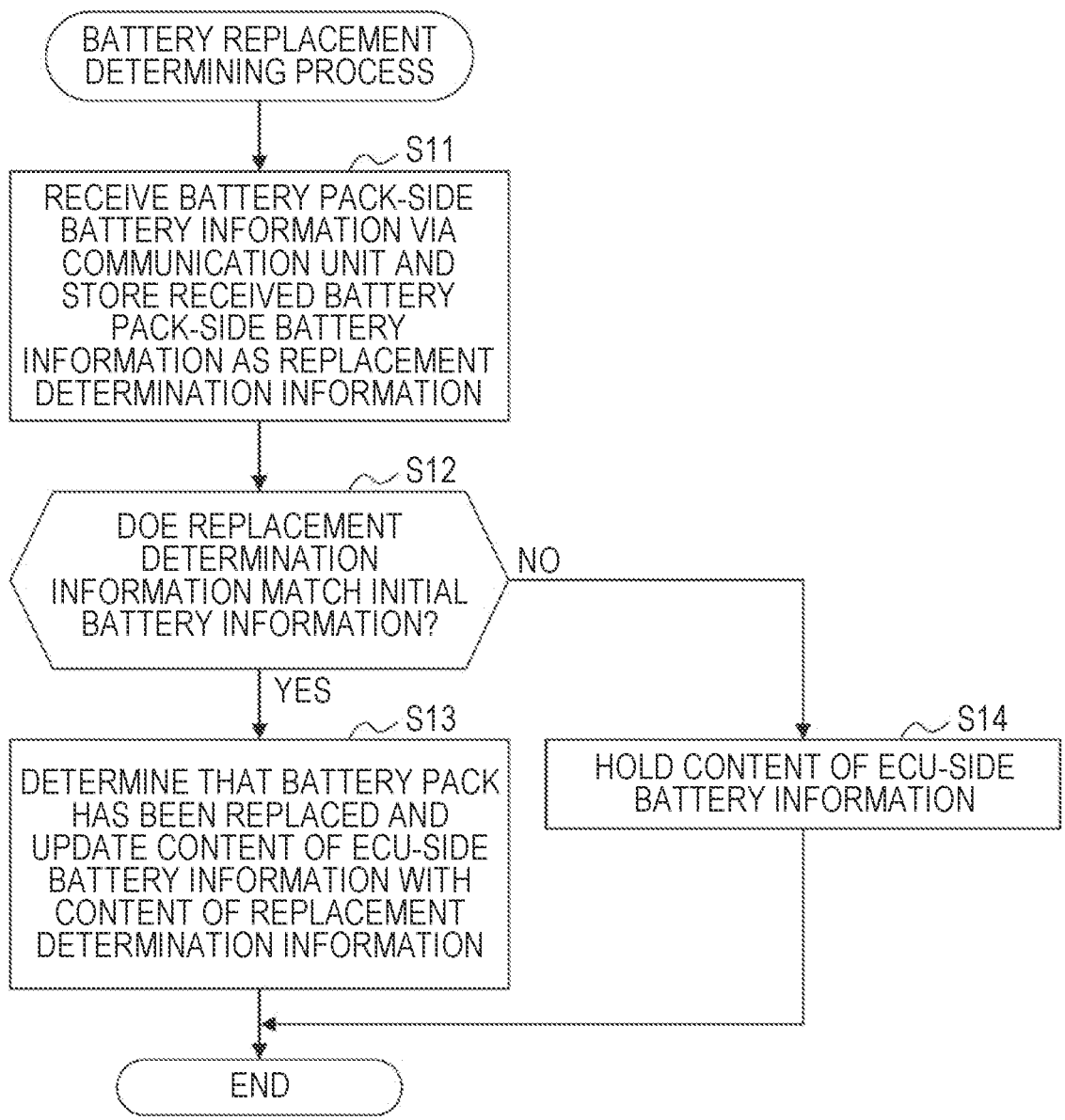

BATTERY MONITORING SYSTEM, VEHICLE, BATTERY MONITORING DEVICE

CROSS-REFERENCE TO RELATED APPLICATION

This application claims priority to Japanese Patent Application No. 2020-212313 filed on Dec. 22, 2020, incorporated herein by reference in its entirety.

BACKGROUND

1. Technical Field

The present disclosure relates to a battery monitoring system that monitors a battery pack which is mounted in a vehicle or the like.

2. Description of Related Art

In the related art, a battery monitoring electronic control unit (ECU) that monitors a battery pack which is mounted in a vehicle, an operation state thereof, and the like is known. Regarding ascertainment of an operation state of a battery pack, a technique of attaching an RFID tag to an external part of the battery pack and storing various types of information required at the time of disposal or recovery is also known (for example, see Japanese Unexamined Patent Application Publication No. 2006-228490 (JP 2006-228490 A)). In this technique, when the battery pack is replaced, information on a used battery pack can be read from the RFID tag and used for a disposal operation or the like.

SUMMARY

In the method using an RFID tag described in JP 2006-228490 A, information on an operation state associated with a used battery pack can be ascertained, but a battery monitoring ECU that monitors a battery pack by communication therewith cannot rapidly ascertain occurrence of replacement even when the battery pack is replaced with a new product. Whether a battery pack has been replaced with a new product can be ascertained by measuring a battery capacity based on charging/discharging after replacement of a battery pack, but this charging/discharging needs a certain time and thus a vehicle cannot be rapidly returned to a user after the battery pack has been replaced.

The present disclosure provides a battery monitoring system that can monitor a battery pack state without requiring costs and rapidly determine whether a battery pack has been replaced with a new product.

According to an aspect of the present disclosure, there is provided a battery monitoring system including a battery pack and a battery monitoring device that monitors a state of a battery cell included in the battery pack. The battery pack includes an acquisition unit configured to acquire battery information of the battery cell, a first storage unit configured to store the acquired battery information, and a first communication unit configured to transmit the battery information stored in the first storage unit to the battery monitoring device. The battery monitoring device includes a second communication unit configured to receive the battery information transmitted from the first communication unit, a second storage unit configured to store the received battery information, and a third storage unit configured to store initial battery information indicating a battery state at the time of manufacture of the battery pack.

With the battery monitoring system according to the present disclosure, it is possible to monitor a battery pack state while curbing an increase in costs for the battery pack and to rapidly determine whether a battery pack has been replaced with a new product.

BRIEF DESCRIPTION OF THE DRAWINGS

Features, advantages, and technical and industrial significance of exemplary embodiments of the present disclosure will be described below with reference to the accompanying drawings, in which like signs denote like elements, and wherein:

FIG. 2 is a diagram illustrating an example of data which is stored in a battery pack storage unit 25;

FIG. 3 is a diagram illustrating an example of data stored in an ECU storage unit 13;

FIG. 4 is a diagram illustrating an example of content (initial battery information) stored as an initial value in the battery pack storage unit 25;

FIG. 6 is a flowchart illustrating details of a replacement determining process according to the embodiment.

DETAILED DESCRIPTION OF EMBODIMENTS

An outline of an embodiment of the present disclosure will be described below. A storage unit that stores battery information indicating a state of battery cells of a battery pack is provided in the battery pack. Initial battery information indicating a state of battery cells of a battery pack which is a new product is stored in a battery monitoring ECU. At the time of manufacture of the battery pack, the initial battery information is stored as an initial value of the battery information in the storage unit of the battery pack. At a predetermining timing, the battery information in the storage unit of the battery pack is compared with the initial battery information stored in the battery monitoring ECU. Since this information matches immediately after the battery pack has been replaced, it is possible to determine that replacement with a new battery pack has occurred.

Embodiment

An embodiment of the disclosure will be described below in detail with reference to the accompanying drawings.

Configuration

Figure 1:
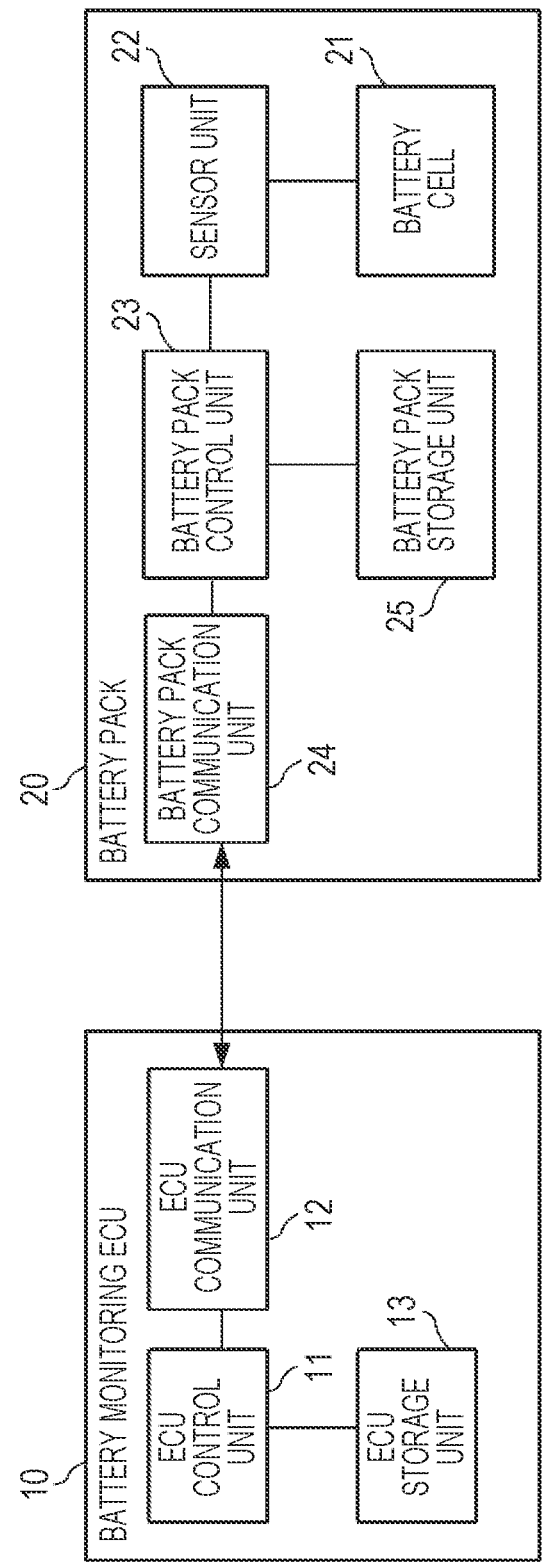
FIG. 1 illustrates a functional block diagram of a battery monitoring system according to an embodiment.

FIG. 1 illustrates a functional block diagram of a battery monitoring system according to an embodiment. The battery monitoring system includes a battery monitoring device (hereinafter referred to as a battery monitoring ECU) 10 and a battery pack 20. The battery monitoring ECU 10 monitors a state of the battery pack 20 and performs various types of control such as overdischarging prevention control. The battery monitoring ECU 10 can also communicate with another ECU (not illustrated) according to necessity and transmit predetermined information indicating the battery pack state to the other ECU. In this embodiment, it is assumed that the battery monitoring system is mounted in a vehicle such as a car.

The battery monitoring ECU 10 includes an ECU control unit 11, an ECU communication unit 12, and an ECU storage unit 13. The ECU control unit 11 is electrically connected to the ECU communication unit 12 and the ECU storage unit 13. The ECU communication unit 12 is communicatively connected to a battery pack communication unit 24 which will be described later and transmits and receives predetermined data to and from the battery pack communication unit 24. The ECU storage unit 13 includes a predetermined readable and writable storage medium (such as a RAM) and stores various types of information used in processes according to this embodiment which will be described later. The ECU control unit 11 controls various types of operations of the battery monitoring ECU 10. Specifically, the ECU control unit 11 acquires battery information from the battery pack 20 via the ECU communication unit 12 and updates information stored in the ECU storage unit 13. The ECU control unit 11 determines whether the battery pack has been replaced with a new battery pack using information stored in the ECU storage unit 13 (a determination unit).

The battery pack 20 will be described below. The battery pack 20 includes a battery cell 21, a sensor unit 22, a battery pack control unit 23, a battery pack communication unit 24, and a battery pack storage unit 25. The battery cell 21 supplies electric power to an electric motor which is not illustrated or other devices by discharge or is charged with electric power obtained by regenerative braking of the electric motor (recovered energy). The sensor unit 22 detects the state of the battery cell 21 at intervals of a predetermined period and outputs a result of detection to the battery pack control unit 23. The battery pack storage unit 25 includes a predetermined readable and writable storage medium (such as a RAM). The battery pack control unit 23 stores various types of information indicting the state of the battery cell 21 as battery pack-side battery information 251 which will be described later in the battery pack storage unit 25 based on the output from the sensor unit 22. The battery pack control unit 23 transmits the battery pack-side battery information 251 to the battery monitoring ECU 10 via the battery pack communication unit 24 in response to a request from the ECU control unit 11. The battery pack communication unit 24 is communicatively connected to the ECU communication unit 12 and transmits and receives predetermined data to and from the ECU communication unit 12.

Details of processes according to this embodiment will be described below.

Data to be Used

Information Stored in Battery Pack Storage Unit

Various types of information used in the processes according to this embodiment will be described below. Data which is stored in the battery pack storage unit 25 will be described first. FIG. 2 is a memory map representing an example of information stored in the battery pack storage unit 25. The battery pack-side battery information 251 is stored in the battery pack storage unit 25. The battery pack-side battery information 251 is information indicating information or various states of the battery cell 21 detected by the sensor unit 22. The battery pack-side battery information 251 includes, for example, information such as a battery internal resistance value, a battery operation time, battery identification information, and an initial capacity value. This information changes according to an operation state of the battery pack.

At the time of manufacture of the battery pack 20, the following information is written as an initial value in the battery pack-side battery information 251. This information is also information which is written for all new battery packs at the time of manufacture thereof. FIG. 4 illustrates an example of information which is written as the initial value. For example, it is assumed that the number of information items included in the battery pack-side battery information 251 is 10. More specifically, information items each constituted by eight bytes are stored as information of 80 bytes. The information items are, for example, a battery internal resistance value and a battery operation time. In this embodiment, as a value indicating a state of a new product, "0x00000000" (all zeros) is set for each of the first to ninth information items. A value "0xAAAAAAAA" is set for the final tenth information item. The value indicating the state of a new product is written for all new battery packs 20 at the time of manufacture thereof. The value which is set for the tenth information item will be complementarily described later.

Information Stored in ECU Storage Unit

Information which is stored in the ECU storage unit 13 will be described below. FIG. 3 illustrates a memory map indicating an example of information which is stored in the ECU storage unit 13. ECU-side battery information 131, replacement determination information 132, and initial battery information 133 are stored in the ECU storage unit 13.

The ECU-side battery information 131 is information including content of the battery pack-side battery information 251 which is acquired from the battery pack 20. The data structure of the ECU-side battery information 131 is the same as the data structure of the battery pack-side battery information 251 illustrated in FIG. 4. The battery monitoring ECU 10 can perform various types of control such as overdischarging prevention control based on the ECU-side battery information 131. Immediately after replacement of the battery pack 20, information associated with the battery pack 20 before the replacement remains in the ECU-side battery information 131 and thus may have different content from the battery pack-side battery information 251 (immediately after the replacement).

The replacement determination information 132 is information which temporarily includes content of the battery pack-side battery information 251 output from the battery pack 20 in a process which will be described below. The data structure of the replacement determination information 132 is the same as the data structure of the battery pack-side battery information 251. The replacement determination information 132 is used to determine whether the battery pack 20 has been replaced in the process which will be described later.

The initial battery information 133 is information indicating a battery state of the battery pack 20 which is a new product. The data structure thereof is the same as the data structure of the battery pack-side battery information 251. At the time of manufacture of the battery monitoring ECU 10, the same content as the initial value of the battery pack-side battery information 251 (see FIG. 4) is stored as information content of the initial battery information 133. The initial battery information 133 is compared with the battery pack-side battery information 251 of the battery pack 20, and it can be determined that the battery pack 20 is a new product, that is, that replacement of a battery pack has occurred, when the information matches.

The information content of the initial battery information 133 will be complementarily described below. In this embodiment, the value "0xAAAAAAAA" instead of "0x00000000" is set for the initial value of the battery pack-side battery information 251 and the final tenth information item out of 10 information items included in the initial battery information 133. This is for considering a likelihood of occurrence of a phenomenon in which the battery pack-side battery information 251 varies to another value due to so-called RANI failure or the like. For example, when the battery pack-side battery information 251 is read from the battery pack storage unit 25, or the like, all the content of the data may vary to "0" for a certain reason. In this case, when all the content of the initial battery information 133 stored in the ECU storage unit 13 is "0x00000000," it matches data content that varies due to RAM failure. As a result, even when a battery pack 20 has not actually been replaced, there is a likelihood that the battery monitoring ECU 10 will erroneously determine that the battery pack 20 has been replaced. Therefore, in this embodiment, all the information items of the content of the initial battery information 133 is not set to "0x00000000" but a certain information item thereof is set to data other than "0x00000000" (the content of the initial battery information 133 in which the final information item is not "0x00000000" is also written for the battery pack storage unit 25 at the time of manufacture of the battery pack 20). By performing the determination of matching in consideration of the information item, it is possible to prevent occurrence of erroneous determination due to RAM failure or the like. In the example illustrated in FIG. 4, when the content in which the first to ninth information items are set to "0x00000000" and the tenth information item is set to "0xAAAAAAAA" matches, it is possible to determine whether replacement of the battery pack 20 has occurred.

In a battery pack 20 which is not a new product, the content of the battery pack-side battery information 251 can be updated with change of the operation state of the battery cell 21. In this case, the tenth information item in FIG. 4 is not limited to any particular purpose of use. For example, information for verification of the ninth information item (for example, a hash value) may be stored and appropriately used.

Battery Information Acquiring Process

Figure 5:
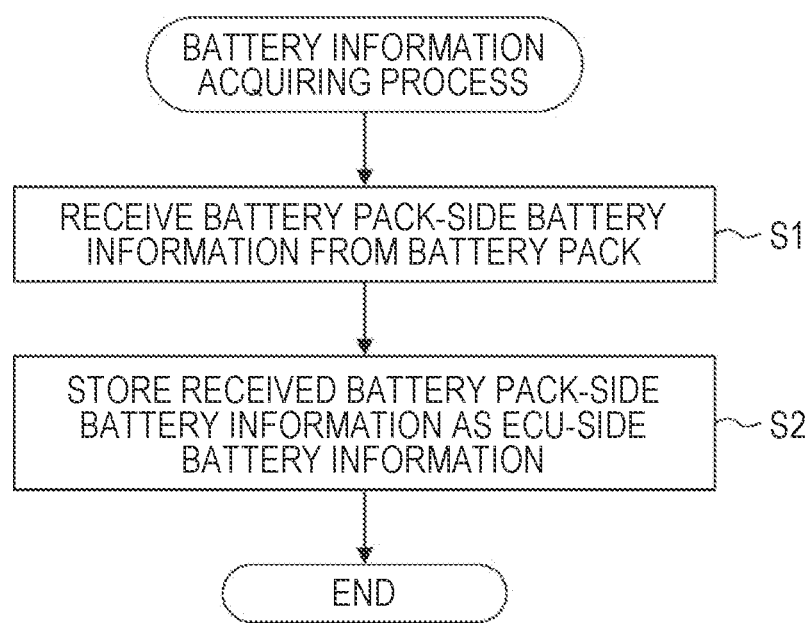
FIG. 5 is a flowchart illustrating details of a battery information acquiring process according to the embodiment.

A battery information acquiring process according to this embodiment will be described below. FIG. 5 is a flowchart illustrating details of the battery information acquiring process. This process is a process for allowing the battery monitoring ECU 10 side to ascertain the operation state of the battery cell 21. More specifically, this process is a process for allowing the battery monitoring ECU 10 side to acquire the content of the battery pack-side battery information 251 and to store the acquired content in the ECU-side battery information 131. For example, this process can be performed at a predetermined timing between when a process of starting a vehicular system is completed and when a shut-down instruction is given. In the following description, the timing at which the battery information acquiring process is performed is referred to as a first timing.

(Step S1) The ECU control unit 11 outputs a request for transmission of battery pack-side battery information 251 to the battery pack control unit 23 via the ECU communication unit 12. The ECU control unit 11 receives battery pack-side battery information 251 transmitted from the battery pack 20 in response thereto.

(Step S2) The ECU control unit 11 stores the received battery pack-side battery information 251 as ECU-side battery information 131.

Through this process, information indicating the operation state of the battery pack 20 (the battery cell 21) (such as a battery operation time and a battery internal resistance value) is stored as the ECU-side battery information 131. In other words, the same value as in the battery pack storage unit 25 is stored in the ECU-side battery information 131. The ECU control unit 11 can ascertain the operation state of the battery pack 20 based on the ECU-side battery information 131.

Replacement Determining Process

A battery pack replacement determining process (hereinafter simply referred to as a replacement determining process) according to this embodiment will be described below in detail. FIG. 6 is a flowchart illustrating details of the replacement determining process. In this embodiment, a timing at which the replacement determining process is performed is a second timing which is different from the first timing. In this embodiment, an example of the second timing is a timing at which the replacement determining process is performed as a part of a "starting process" at the time of starting of a vehicular system. When it is assumed that a battery pack has just been replaced, the replacement determining process can be performed at a timing at which the vehicular system is started after a battery pack has been replaced in a factory or the like. Accordingly, it is possible to rapidly determine whether a battery pack has been replaced without performing charging/discharging after the battery pack has been replaced as in the related art.

The second timing is not limited to the aforementioned timing. For example, the replacement determining process may be performed as a part of a process at the time of shut-down of the vehicular system. In this case, when a vehicular system is temporarily started and then a shut-down operation of the vehicular system is performed after a battery pack has been replaced in a factory or the like, the replacement determining process can be performed as a part of the ending process (the shut-down process). For example, the replacement determining process may be performed at the same timing as the first timing.

(Step S11) The ECU control unit 11 outputs a request for transmission of battery pack-side battery information 251 to the battery pack control unit 23 via the ECU communication unit 12. Then, the ECU control unit 11 receives battery pack-side battery information 251 which is transmitted from the battery pack 20 in response thereto and stores the received battery pack-side battery information 251 as replacement determination information 132.

(Step S12) The ECU control unit 11 compares the content of the replacement determination information 132 with initial battery information 133 stored in the ECU storage unit 13 and determines whether the information matches.

In this embodiment, all the information items are used as information which is used to determine the matching, but in another embodiment, only some of the information may be used. For example, the determination may be performed by comparing only a battery internal resistance value and the tenth information item (information for preventing occurrence of erroneous determination) described above with reference to FIG. 4.

(Step S13) When it is determined in Step S12 that the information matches (YES in Step S12), the battery pack 20 is considered to have been replaced. Accordingly, the ECU control unit 11 updates the content of the ECU-side battery information 131 with the replacement determination information 132. That is, the content stored as the ECU-side battery information 131 before the replacement is replaced with information of a battery pack after the replacement has been performed. Accordingly, it is possible to prevent the battery monitoring ECU 10 from performing a predetermined process based on an operation state of a battery pack before the battery pack has been replaced even if the replacement has been performed.

(Step S14) On the other hand, when it is determined in Step S12 that the information does not match (NO in Step S12), the battery pack 20 is considered not to have been replaced. In this case, the ECU control unit 11 does not perform the aforementioned update. As a result, the content of the ECU-side battery information 131 is maintained.

In this way, the battery replacement determining process according to this embodiment ends.

Advantages

As described above, according to this embodiment, a battery pack 20 includes a battery pack storage unit 25 and battery information indicating a state of a battery cell is stored in the battery pack storage unit 25. Accordingly, for example, in comparison with a case in which information is stored in the form of an RFID tag or the like outside of a battery pack, it is possible to make the structure of the battery pack more compact and to utilize battery information.

In this embodiment, initial battery information indicating a battery pack state of a new product is stored in the ECU storage unit 13 or the same content thereof is written as an initial value for the battery pack storage unit 25 at the time of manufacture of the battery pack 20. At a timing at which communication between the battery monitoring ECU 10 and the battery pack 20 is performed after the battery pack has been replaced, the battery monitoring ECU 10 compares the battery information of the battery pack storage unit 25 with the initial battery information. When replacement of a battery pack has occurred, it can be determined that the information matches and the replacement has been performed. Accordingly, since occurrence of replacement of a battery pack 20 can be rapidly determined without charging or discharging of the battery pack after it is replaced (since a predetermined process accompanying the replacement can be performed by a vehicular system), it is possible to rapidly return a vehicle to a user after a battery pack 20 has been replaced.

Modified Example

It is also possible to determine occurrence of replacement of the battery monitoring ECU 10 instead of the battery pack 20 using the aforementioned configuration. The battery monitoring ECU 10 sets "0x00000000" for all information items as initial values of the ECU-side battery information 131 of the ECU storage unit 13 at the time of manufacture thereof. Accordingly, when the battery monitoring ECU 10 is replaced, the content stored in the ECU-side battery information 131 may be initialized and may not match the battery pack-side battery information 251. Therefore, for example, a process of comparing the ECU-side battery information 131 with battery pack-side battery information may be performed as a part of a process at the time of starting of a vehicular system and it may be determined that the battery monitoring ECU 10 has been replaced when the information does not match. Accordingly, it is possible to curb an increase in unnecessary costs for storing information used to determine replacement of the battery monitoring ECU in an ECU associated with a system other than the battery monitoring ECU.

In another embodiment, a configuration in which the replacement determination information 132 is not used may be employed. In this case, the content of the ECU-side battery information 131 updated as a result of the battery information acquiring process may be compared with the initial battery information 133, and the battery pack may be determined to be replaced and a predetermined process may be performed when the information matches.

A configuration in which the content of the initial battery information 133 is able to be updated may be employed. For example, it is assumed that battery packs 20 with new specifications are released and an existing battery pack is replaced with a battery pack with the new specifications in a battery pack replacing operation after a predetermined period of time has elapsed. It is assumed that a value indicating a state of a new product in the battery pack with the new specifications is different from that of the existing battery packs. In this case, at the same time as or prior to the replacement operation, the content of the initial battery information 133 may be updated with a value indicating a state of a new product associated with the battery pack with the new specifications.

While an embodiment of the present disclosure has been described above, the present disclosure can be understood as a method which is performed by a battery monitoring device of a battery monitoring system including a processor and a memory, a control program for the method, a non-transitory computer-readable recording medium having the control program stored therein, a vehicle in which the battery monitoring system is mounted, or the like in addition to the battery monitoring system.

The technique according to the present disclosure can be used for a system for monitoring a state of a battery pack.

What is claimed is:

1. A battery monitoring system comprising:
a battery pack; and
a battery monitoring device that monitors a state of a battery cell included in the battery pack,
wherein the battery pack includes
an acquisition unit configured to acquire battery information of the battery cell,
a first storage unit configured to store the acquired battery information, and
a first communication unit configured to transmit the battery information stored in the first storage unit to the battery monitoring device, and
wherein the battery monitoring device includes
a second communication unit configured to receive the battery information transmitted from the first communication unit,
a second storage unit configured to store the received battery information,
a third storage unit configured to store initial battery information indicating a battery state at the time of manufacture of the battery pack, and
a determination unit configured to determine that the battery pack has been replaced with a new battery pack when the battery information stored in the second storage unit matches the initial battery information.

2. The battery monitoring system according to claim 1, wherein the battery monitoring device performs a predetermined process based on a result of determination when the determination unit determines that the battery pack has been replaced.

3. The battery monitoring system according to claim 2, wherein the battery monitoring device further includes a fourth storage unit configured to store the battery information which has been received at a first timing by the second communication unit, and
wherein the battery information stored in the fourth storage unit is updated with the battery information received by the second communication unit at a second timing other than the first timing when the determination unit determines that the battery pack has been replaced at the second timing after the battery information has been stored in the fourth storage unit.

4. A vehicle in which the battery monitoring system according to claim 1 is mounted.

\* \* \* \* \*